(12) United States Patent  (10) Patent No.: US 9,378,102 B1
Ahmad et al.  (45) Date of Patent: Jun. 28, 2016

(54) SAFETY HARDWARE AND/OR SOFTWARE FAULT TOLERANCE USING REDUNDANT CHANNELS

(71) Applicant: Xilinx, Inc., San Jose, CA (US)

(72) Inventors: Sagheer Ahmad, Cupertino, CA (US); Bradley L. Taylor, Santa Cruz, CA (US); Giulio Corradi, Munich (DE)

(73) Assignee: XILINX, INC., San Jose, CA (US)

( * ) Notice: Subject to any disclaimer, the term of this patent is extended or adjusted under 35 U.S.C. 154(b) by 146 days.

(21) Appl. No.: 14/452,858

(22) Filed: Aug. 6, 2014

(51) Int. Cl.
  *G06F 11/07* (2006.01)
  *G06F 11/20* (2006.01)
  *H03K 19/177* (2006.01)
  *H03K 19/007* (2006.01)

(52) U.S. Cl.
  CPC .......... *G06F 11/2007* (2013.01); *H03K 19/007* (2013.01); *H03K 19/17764* (2013.01)

(58) Field of Classification Search
  CPC .................................................... G06F 11/0793
  USPC .................................................... 714/4.11, 27
  See application file for complete search history.

(56) References Cited

U.S. PATENT DOCUMENTS

2013/0308440 A1* 11/2013 Grossman ............ H04L 65/605
  370/218
2015/0371048 A1* 12/2015 Schwellnus ............ G06F 21/60
  726/26

FOREIGN PATENT DOCUMENTS

CN 102819706 A * 12/2012

* cited by examiner

*Primary Examiner* — Chae Ko
(74) *Attorney, Agent, or Firm* — Gerald Chan

(57) ABSTRACT

A system on a chip (SoC) for providing safety hardware fault tolerance and/or safety software fault tolerance includes a first safety sub-system having a first safety channel; a second safety sub-system having a second safety channel; and a third sub-system. The first safety sub-system is independent of the second safety sub-system to allow the second safety sub-system to communicate through the second safety channel when the first safety sub-system or the third subsystem fails, and further to allow the first safety sub-system to communicate through the first safety channel when the second safety sub-system or the third subsystem fails.

20 Claims, 3 Drawing Sheets

US 9,378,102 B1

SAFETY HARDWARE AND/OR SOFTWARE FAULT TOLERANCE USING REDUNDANT CHANNELS

TECHNICAL FIELD

This application relates generally to a system-on-a-chip (SoC) and in particular to providing safety hardware fault tolerance and/or safety software fault tolerance for the SoC.

BACKGROUND

A system-on-a-chip (SoC) is an integrated circuit that integrates multiple components of a computer or other electronic system into a single chip. It may contain digital, analog, mixed-signal, and radio-frequency functions all on a single chip substrate.

An SoC may be used for various applications, and subsystems of the SoC may be utilized to implement safety features for those applications, including monitoring, error detection, error correction, etc. For example, an SoC may be used to monitor the functionality and performance of various features in a vehicle, or to monitor the functionality and performance of various features in a manufacturing setting.

SUMMARY

A system on a chip (SoC) for providing safety hardware fault tolerance and/or safety software fault tolerance includes a first safety sub-system having a first safety channel; a second safety sub-system having a second safety channel; and a third sub-system. The first safety sub-system is independent of the second safety sub-system to allow the second safety sub-system to communicate through the second safety channel when the first safety sub-system or the third subsystem fails, and further to allow the first safety sub-system to communicate through the first safety channel when the second safety sub-system or the third subsystem fails.

A method for providing for safety hardware fault tolerance and/or safety software fault tolerance to a system-on-a-chip (SoC) includes providing a first safety channel for a first safety sub-system of the SoC; and providing a second safety channel for a second safety sub-system of the SoC. The first safety sub-system is independent of the second safety sub-system to allow the second safety sub-system to communicate through the second safety channel when the first safety sub-system fails, and further to allow the first safety sub-system to communicate through the first safety channel when the second safety sub-system fails.

Other aspects and features will be evident from reading the following detailed description.

BRIEF DESCRIPTION OF THE DRAWINGS

The drawings illustrate the design and utility of various examples, in which similar elements are referred to by common reference numerals. These drawings are not necessarily drawn to scale. In order to better appreciate how the above-recited and other advantages and objects are obtained, a more particular description of the examples will be rendered which are illustrated in the accompanying drawings. These drawings depict only examples and are not therefore to be considered limiting of the scope of the claims.

DETAILED DESCRIPTION

Figure 1:
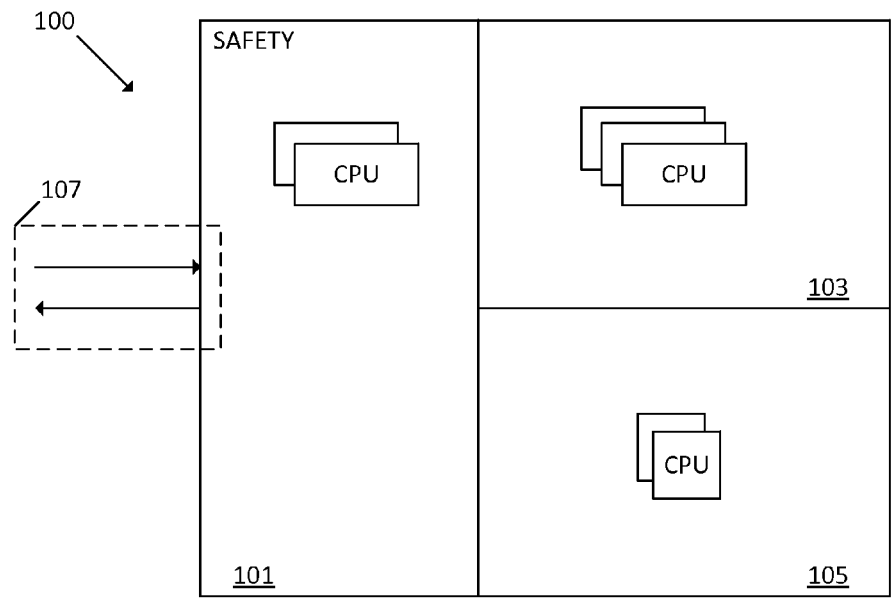
FIG. 1 illustrates a system-on-a-chip (SoC) for providing safety functionality that implements a single safety channel.

Various examples are described hereinafter with reference to the figures. It should be noted that the figures are not drawn to scale and that the elements of similar structures or functions are represented by like reference numerals throughout the figures. It should also be noted that the figures are only intended to facilitate the description of the examples. They are not intended as an exhaustive description of the invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated.

An SoC may include safety sub-systems (e.g., safety hardware components of the SoC) that are utilized to implement safety features. However only a single safety channel is typically dedicated for communicating information from the safety sub-systems of the SoC to any environment external to the SoC. For example, the safety channel may be coupled to a single safety sub-system, such that communication from other safety sub-systems of the SoC must go through the single safety sub-system having the safety channel. While the other safety sub-systems may communicate information amongst each other, they cannot communicate with entities outside of the SoC without utilizing the safety sub-system coupled to the safety channel. A major disadvantage of such a setup is that the SoC cannot tolerate any failure of the sub-system having the safety channel. At the point in time that the safety sub-system having the safety channel goes down, no communication can be made with the safety sub-systems in the SoC. This may lead to various errors and undesirable behavior including violation of safety functionality of the SoC.

To address the above disadvantage, an SoC for providing safety hardware fault tolerance and/or safety software fault tolerance is provided. The SoC includes a first safety sub-system having a first safety channel; a second safety sub-system having a second safety channel; and a third sub-system. The first safety sub-system is independent of the second safety sub-system to allow the second safety sub-system to communicate through the second safety channel when the first safety sub-system or third subsystem fails, and further to allow the first safety sub-system to communicate through the first safety channel when the second safety sub-system or third subsystem fails.

FIG. 1 illustrates a system-on-a-chip (SoC) for providing safety functionality that implements a single safety channel. The SoC 100 depicted in FIG. 1 includes three different sub-systems 101, 103, 105 each implementing one or more processing cores. Sub-system 101 is a safety sub-system, which means that it provides certain safety functionality for the SoC 100. Safety functionality may encompass such features as performance monitoring, error detection, error correction, other measure(s) to achieve the necessary safety integrity for the required safety functions, etc., or any combination thereof. The SoC also includes sub-systems 103 and 105, which may or may not be safety sub-systems (e.g., may or may not provide safety functionality).

A single dedicated safety channel 107 is coupled to safety sub-system 101 to allow for safety-related communications to and from safety sub-systems of the SoC. Where sub-systems 103 and 105 are safety sub-systems, they must go through safety sub-system 101 and its corresponding safety channel 107 to communicate safety-related information externally. Because only a single safety channel 107 is provided for the SoC 100, the SoC 100 may not be able to tolerate failure of safety hardware. Said otherwise, if the safety sub-system 101 fails, the SoC 100 will be unable to communicate any safety-related information to the outside world or receive any safety-related information from the outside world for the period of time that the safety sub-system 101 is down, thereby resulting in loss of capability to achieve or maintain the safe state for the SoC 100.

During that down time, the SoC 100 may begin to exhibit undesirable behavior and may violate the condition(s) necessary to achieve or maintain a safe state. In an environment where accurate safety conditions are needed, having an SoC 100 that is unable to tolerate safety hardware failure may be extremely problematic.

In order to provide fault tolerance to safety hardware of the SoC, one or more additional redundant safety channels may be implemented with the SoC. In this way, when one safety sub-system fails or otherwise goes down, another safety sub-system having its own safety channel may continue to be operational and may continue to provide a conduit for receiving and relaying safety-related information to the outside world.

Figure 2:
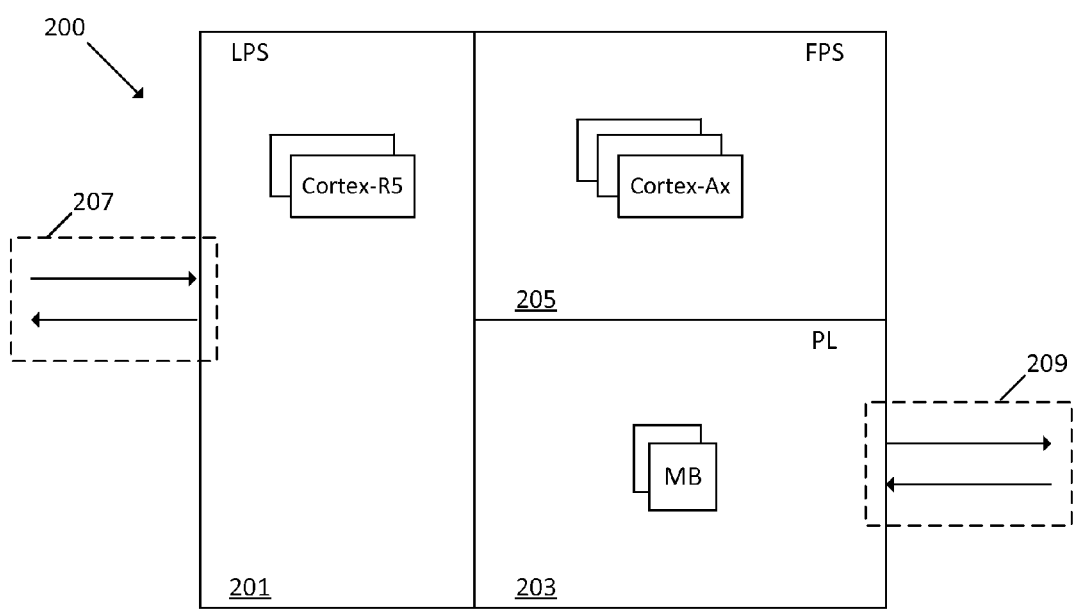
FIG. 2 illustrates a first SoC for providing safety functionality that implements redundant safety channels for safety hardware fault tolerance and/or safety software fault tolerance.

FIG. 2 illustrates an SoC for providing safety functionality that implements redundant safety channels for safety hardware fault tolerance and/or safety software fault tolerance.

The SoC 200 illustrated in FIG. 2 includes a first safety sub-system 201, a second safety sub-system 203 and a third non-safety sub-system 205. The first safety sub-system 201 may include a first safety channel 207 and the second safety sub-system 203 may include a second safety channel 209.

By providing the second safety sub-system 203 with a second safety channel 209, the first safety sub-system 201 becomes independent of the second safety sub-system 203. This allows for the second safety sub-system 203 to continue to communicate through the second safety channel 209 even when the first safety sub-system 201 or third sub-system 203 fails. Similarly, the first safety sub-system 201 is allowed to continue to communicate through the first safety channel 207 when the second safety sub-system 203 or third subsystem 205 fails.

Thus, having two redundant safety channels rather than a single safety channel for communicating safety related information from the safety sub-systems to the outside world allows for greater fault tolerance, as the failure of one safety channel will not limit the operational ability of the other safety channel.

The first safety sub-system 201, the second safety sub-system 203 and the third sub-system 205 may each have their own dedicated power rail in some cases. The first safety sub-system 201, second safety sub-system 203 and third sub-system 205 may be isolated from each other such that each sub-system's power source, reset ability, temperature control, bus structure, or any combination thereof, may be independent of one another. Furthermore, each sub-system may be provided its individual voltage and temperature monitoring functionality, and/or timing mechanisms.

In some cases, the first safety sub-system 201 may be a low power system (LPS) that is implemented using a real-time processing. In some cases, the second safety sub-system 203 may be implemented as a programmable logic (PL) sub-system. In some cases, the third sub-system 205 may be a full power system (FPS) that is implemented using an application processing sub-system.

Each safety sub-system 201, 203 may be associated with a different safety integrity level (SIL). The SIL is a measurement of the relative level of risk-reduction provided by a safety sub-system, with a higher SIL ensuring a greater level of dependability than a lower SIL. In some cases, the first safety sub-system may have a SIL that is higher than a SIL of the second safety sub-system 203. For example, the first safety sub-system 201 may have a SIL of 3 and the second safety sub-system 203 may have a SIL of 2. In other cases, the first safety sub-system 201 may have a SIL that is lower than a SIL of the second safety sub-system 203. In further cases, the first safety sub-system 201 may have a SIL that is equal to a SIL of the second safety sub-system 203.

To further isolate failure of the first safety sub-system 201 from the second safety sub-system 203 and the third sub-system 205, the first safety sub-system 201 may be implemented with a different processor type than that used to implement the second safety sub-system 203 and the third sub-system 205. The implementation of the sub-systems 201, 203, 205 with different processors may allow significant reduction of systematic failures (SFAIL), may improve the systematic capabilities (SC), and/or may reduce the impact of common cause failures (CCF) because of processors diversity. For example, the first safety sub-system 201 may be implemented with an ARM Cortex-Rx processing core, the second safety sub-system 203 may be implemented using a MicroBlaze (MB) processing core available at Xilinx, Inc., in San Jose, Calif., and the third sub-system 205 may be implemented using an ARM Cortex-Ax processing core. The diversity allows mitigation of systematic errors at hardware and/or software level. In other cases, the first safety sub-system 201 may be implemented using state machine(s) in programmable logic, and the second safety sub-system 203 and the third sub-system 205 may be implemented using different respective processor types.

In further cases, the first safety sub-system 201, the second safety sub-system 203, and the third sub-system 205 may be implemented with other types of processors that are different from the examples described above. The first, second, and third sub-systems 201, 203, 205 may be implemented with processors of the same type, or with different respective processors.

In some cases, the first safety sub-system 201, second safety sub-system 203, and third safety sub-system 205 may also utilize different respective data endians, different respective word lengths, and/or different respective instruction sets, in order to provide software diversity for the different safety channels 207, 209 for improving tolerance on random faults and systematic errors (SE). The diversity allows mitigation of systematic errors at hardware and/or software level.

Thus, the SoC having a single safety channel is provided a greater level of fault tolerance (at hardware and/or software level) through the second safety channel. Moreover, the use of different processing environments (e.g., different processing cores, power supplies, etc.) for implementing each of the different sub-systems further mitigates the potential systematic failures that may occur in a homogenous system thereby greatly reducing any latent failures caused by common errors in design flow and tools.

In some cases, the first safety sub-system 201 may optionally be relocatable statically or dynamically. For example, the first safety sub-system 201 may be relocatable statically or dynamically in an area of a programmable logic of an integrated circuit as a function of a certain pre-defined condition. The integrated circuit may be a field programmable grid array (FPGA), or any of other types of processors, etc. Also, in some cases, the second safety sub-system 203 and/or the third sub-system 205 may be relocatable statically or dynamically.

Figure 3:
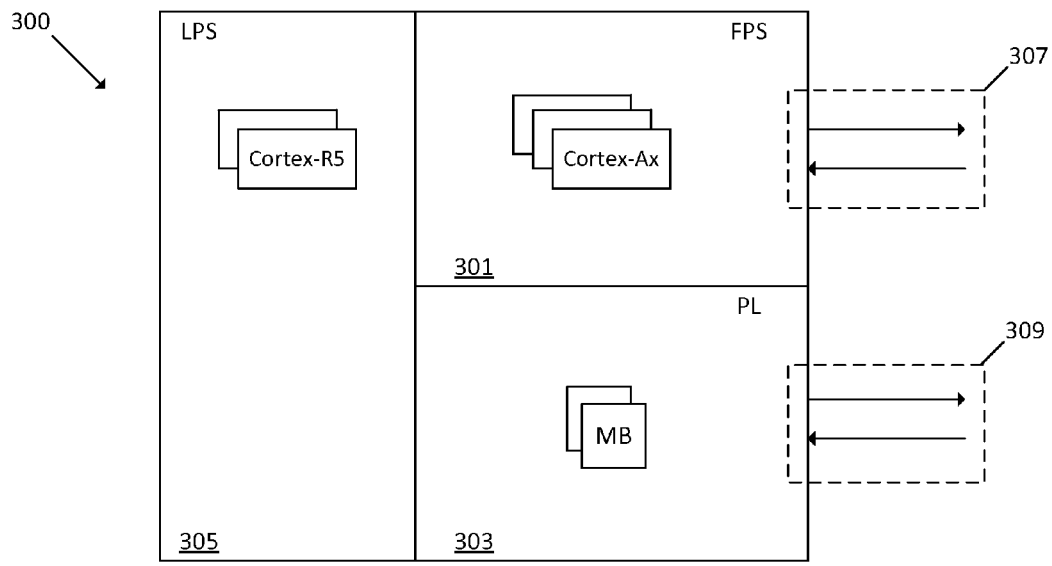
FIG. 3 illustrates a second SoC for providing safety functionality that implements redundant safety channels for safety hardware fault tolerance and/or safety software fault tolerance.

FIG. 3 illustrates an alternative SoC for providing safety functionality that implements redundant safety channels for safety hardware fault tolerance and/or safety software fault tolerance.

The SoC 300 illustrated in FIG. 3 includes a first safety sub-system 301, a second safety sub-system 303 and a third non-safety sub-system 305. The first safety sub-system 301 may include a first safety channel 307 and the second safety sub-system 303 may include a second safety channel 309.

By providing the second safety sub-system 303 with a second safety channel 309, the first safety sub-system 301 becomes independent of the second safety sub-system 303. This allows for the second safety sub-system 303 to continue to communicate through the second safety channel 309 even when the first safety sub-system 301 or third subsystem 305 fails. Similarly, the first safety sub-system 301 is allowed to continue to communicate through the first safety channel 307 when the second safety sub-system 303 or third subsystem 305 fails.

Thus, having two redundant safety channels rather than a single safety channel for communicating safety related information from the safety sub-systems to the outside world allows for greater fault tolerance, as the failure of one safety channel will not limit the operational ability of the other safety channel.

The first safety sub-system 301, the second safety sub-system 303 and the third sub-system 305 may each have their own dedicated power rail. The first safety sub-system 301, second safety sub-system 303 and third sub-system 305 may be isolated from each other such that each sub-system's power source, reset ability, temperature control, bus structure, or any combination thereof, may be independent of one another. Furthermore, each sub-system may be provided its individual voltage and temperature monitoring functionality, and/or timing mechanisms.

In some cases, the first safety sub-system 301 may be a full power system (FPS) that is implemented as an application processing sub-system. In some cases, the second safety sub-system 303 may be implemented as a programmable logic (PL) sub-system. In some cases, the third sub-system 305 may be a low power system (LPS) that is implemented using a real-time processing sub-system.

Each safety sub-system 301, 303 may be associated with a different safety integrity level (SIL). The SIL is a measurement of the relative level of risk-reduction provided by a safety sub-system, with a higher SIL ensuring a greater level of dependability than a lower SIL. In some cases, the first safety sub-system 301 may have a SIL that is lower than the SIL of the second safety sub-system 303. For example, the first safety sub-system 301 may have a SIL of 1 and the second safety sub-system 303 may have a SIL of 2. In other cases, the first safety sub-system 301 may have a SIL that is lower than a SIL of the second safety sub-system 303. In further cases, the first safety sub-system 301 may have a SIL that is equal to a SIL of the second safety sub-system 303.

To further isolate failure of the first safety sub-system 301 from the second safety sub-system 303 and the third sub-system 305, the first safety sub-system 301 may be implemented with a different processor type than that used to implement the second safety sub-system 303 and the third sub-system 305. The implementation of the sub-systems 301, 303, 305 with different processors may allow significant reduction of systematic failures (SFAIL), may improve the systematic capabilities (SC), and/or may reduce the impact of common cause failures (CCF) because of processors diversity. For example, the first safety sub-system 301 may be implemented with an ARM Cortex-Ax processing core, the second safety sub-system 303 may be implemented using a MicroBlaze (MB) processing core available at Xilinx, Inc. in San Jose, Calif., and the third sub-system 305 may be implemented using an ARM Cortex-Ax processing core. The diversity allows mitigation of systematic errors at hardware and/or software level. In other cases, the first safety sub-system 301 may be implemented using state machine(s) in programmable logic, and the second safety sub-system 303 and the third sub-system 305 may be implemented using different respective processor types.

In further cases, the first safety sub-system 301, the second safety sub-system 303, and the third sub-system 305 may be implemented with other types of processors that are different from the examples described above. The first, second, and third sub-systems 301, 303, 305 may be implemented with processors of the same type, or with different respective processors.

In some cases, the first safety sub-system 301, second safety sub-system 303 and third safety sub-system 305 may also utilize different respective data endians, different respective word lengths, and/or different respective instruction sets, in order to provide software diversity for the different safety channels 307, 309 for improving tolerance on random faults and systematic errors. The diversity allows mitigation of systematic errors at hardware and/or software level.

Thus, the SoC having a safety channel is provided a greater level of fault tolerance (at hardware and/or software level) through the second safety channel. Moreover, the use of different processing environments (e.g., different processing cores, power supplies, etc.) for implementing each of the different sub-systems further mitigates the potential systematic failures that may occur in a homogenous system thereby greatly reducing any latent failures caused by common errors in design flow and tools.

In some cases, the first safety sub-system 301 may optionally be relocatable statically or dynamically. For example, the first safety sub-system 301 may be relocatable statically or dynamically in an area of a programmable logic of an integrated circuit as a function of a certain pre-defined condition. The integrated circuit may be a field programmable grid array (FPGA), or any of other types of processors, etc. Also, in some cases, the second safety sub-system 303 and/or the third sub-system 305 may be relocatable statically or dynamically.

Figure 4:
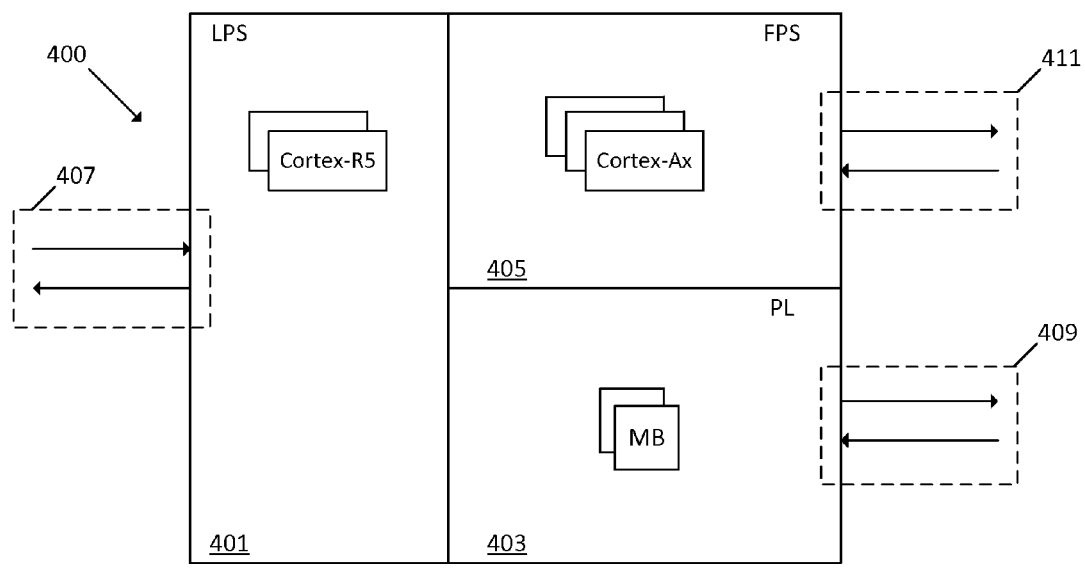
FIG. 4 illustrates a third SoC for providing safety functionality that implements redundant safety channels for safety hardware fault tolerance and/or safety software fault tolerance.

FIG. 4 illustrates yet another alternative SoC for providing safety functionality that implements redundant safety channels for safety hardware fault tolerance and/or safety software fault tolerance.

The SoC 400 in FIG. 4 differs from the SoCs illustrated in FIGS. 2 and 3, in that the SoC 400 in FIG. 4 includes an additional third safety channel to provide an even greater level of fault tolerance, as discussed in additional detail below.

The SoC 400 illustrated in FIG. 4 includes a first safety sub-system 401, a second safety sub-system 403 and a third safety sub-system 405. The first safety sub-system 401 may include a first safety channel 407, the second safety sub-system 403 may include a second safety channel 409, and the third safety sub-system 405 may include a third safety channel 411.

By providing the second safety sub-system 403 with a second safety channel 409, and the third safety sub-system 405 with a third safety channel 411, the first safety sub-system 401, second safety sub-system 403 and third safety sub-system 405 become independent of one another. This allows for the first safety sub-system 401 to continue to communicate through the first safety channel 407 when either the second safety sub-system 403 or third safety sub-system 405 fails. Similarly, the second safety sub-system 403 is allowed to continue to communicate through the second safety channel 409 even when the first safety sub-system 401 or third safety subsystem 405 fails. In the same way, the third safety sub-system 405 is allowed to continue to communicate through the third safety channel 411 when either the second safety sub-system 403 or first safety sub-system 401 fails.

Thus, having three redundant safety channels rather than a single safety channel for communicating safety related information from the safety sub-systems to the outside world allows for greater fault tolerance (at hardware and/or software level), as the failure of one or two safety channels will not limit the operational ability of the other safety channel.

The first safety sub-system 401, the second safety sub-system 403 and the third sub-system 405 may each have their own dedicated power rail. The first safety sub-system 401, second safety sub-system 403 and third safety sub-system 405 may be isolated from each other such that each sub-system's power source, reset ability, temperature control, bus structure, or any combination thereof, may be independent of one another. Furthermore, each sub-system may be provided its individual voltage and temperature monitoring functionality and/or timing mechanisms.

In some cases, the first safety sub-system 401 may be a low power system (LPS) that is implemented using a real-time processing sub-system. In some cases, the second safety sub-system 403 may be implemented as a programmable logic (PL) sub-system. In some cases, the third sub-system 405 may be a full power system (FPS) that is implemented as an application processing sub-system.

Each safety sub-system 401, 403, 405 may be associated with a different safety integrity level (SIL). The SIL is a measurement of the relative level of risk-reduction provided by a safety sub-system, with a higher SIL ensuring a greater level of dependability than a lower SIL. In some cases, the first safety sub-system 401 may have a SIL that is higher than the SIL of the second safety sub-system 403. Also, in some cases, the second safety sub-system 403 may have a SIL that is higher than the SIL of the third safety sub-system 405. For example, the first safety sub-system 401 may have a SIL of 3, the second safety sub-system 403 may have a SIL of 2 and the third safety sub-system 405 may have a SIL of 1. In other cases, the first safety sub-system 401 may have a SIL that is lower than a SIL of the second safety sub-system 403. In further cases, the first safety sub-system 401 may have a SIL that is equal to a SIL of the second safety sub-system 403.

To further isolate failure of the first safety sub-system 401 from the second safety sub-system 403 and the third safety sub-system 405, the first safety sub-system 401 may be implemented with a different processor type than that used to implement the second safety sub-system 403 and the third safety sub-system 405. The implementation of the safety sub-systems 401, 403, 405 with different processors may allow significant reduction of systematic failures (SFAIL), may improve the systematic capabilities (SC), and/or may reduce the impact of common cause failures (CCF) because of processors diversity. For example, the first safety sub-system 401 may be implemented with an ARM Cortex-Rx processing core, the second safety sub-system 403 may be implemented using a MicroBlaze (MB) processing core available at Xilinx, Inc. in San Jose, Calif., and the third safety sub-system 405 may be implemented using an ARM Cortex-Ax processing core. The diversity allows mitigation of systematic errors at hardware and/or software level. In other cases, the first safety sub-system 401 may be implemented using state machine(s) in programmable logic, and the second safety sub-system 403 and the third sub-system 405 may be implemented using different respective processor types.

In further cases, the first safety sub-system 401, the second safety sub-system 403, and the third safety sub-system 405 may be implemented with other types of processors that are different from the examples described above. The first, second, and third safety sub-systems 401, 403, 405 may be implemented with processors of the same type, or with different respective processors.

In some cases, the first safety sub-system 401, second safety sub-system 403 and third safety sub-system 405 may also utilize different respective data endians, different respective word lengths, and/or different respective instruction sets, in order to provide software diversity for the different safety channels 407, 409 and 411 for improving tolerance on random faults and systematic errors. The diversity allows mitigation of systematic errors at hardware and/or software level.

Thus, the SoC having a safety channel is improved upon and provided a greater level of fault tolerance (at hardware and/or software level) through the second safety channel and third safety channel. Moreover, the use of different processing environments (e.g., different processing cores, power supplies, etc.) for implementing each of the different sub-systems further mitigates the potential systematic failures that may occur in a homogenous system thereby greatly reducing any latent failures caused by common errors in design flow and tools.

In some cases, the first safety sub-system 401 may optionally be relocatable statically or dynamically. For example, the first safety sub-system 401 may be relocatable statically or dynamically in an area of a programmable logic of an integrated circuit as a function of a certain pre-defined condition. The integrated circuit may be a field programmable grid array (FPGA), or any of other types of processors, etc. Also, in some cases, the second safety sub-system 403 and/or the third safety sub-system 405 may be relocatable statically or dynamically.

Figure 5:
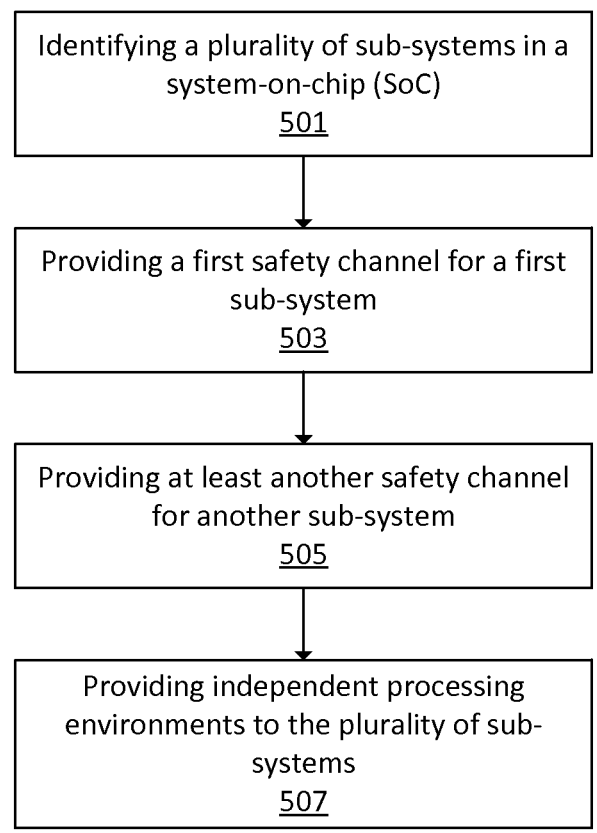
FIG. 5 illustrates a method for implementing redundant safety channels for providing for safety hardware fault tolerance and/or safety software fault tolerance to a system-on-a-chip (SoC).

FIG. 5 illustrates a method for implementing redundant safety channels for providing for safety hardware fault tolerance and/or safety software fault tolerance to an SoC.

Initially a plurality of sub-systems in the SoC is identified as shown at item 501. The plurality of sub-systems in the SoC may include two or more safety sub-systems.

A first safety channel is then provided for a first safety sub-system of the SoC as shown at item 503 and at least another safety channel is provided for another safety sub-system of the SoC as shown at item 505.

In some cases, a first safety channel may be provided for a first safety sub-system and a second safety channel may be provided for a second safety sub-system. The first safety sub-system may be implemented as a programmable logic sub-system and the second safety sub-system of the SoC may be a low power system that is implemented using a real-time processing sub-system or alternatively a full power system that is implemented as an application processing sub-system.

In some cases, a first safety channel may be provided for a first safety sub-system, a second safety channel may be provided for a second safety sub-system and a third safety channel may be provided for a third safety sub-system. The first safety sub-system may be implemented as a programmable logic sub-system, the second safety sub-system of the SoC may be a low power system that is implemented using a real-time processing sub-system and the third safety sub-system of the SoC may be a full power system that is implemented as an application processing sub-system.

By providing at least one redundant safety channel for the SoC, the SoC is able to better tolerate fault and allows safety sub-systems having a safety channel to be independent of each other. Communication by a safety sub-system through its corresponding safety channel remains operational even where a failure of a different safety sub-system or non-safety sub-system in the SoC occurs.

To further isolate failure of the plurality of sub-systems in the SoC, each of the sub-systems may optionally be provided with independent processing environments as shown at item 507. Each of the plurality of sub-systems may have their own dedicated power rail and/or may operate using a different processing core. Additionally, each of the plurality of sub-systems may be isolated from one another such that each sub-system's power source, reset ability, temperature control, bus structure, or any combination thereof, may be independent of one another. Furthermore, each sub-system may be provided its individual voltage and temperature monitoring functionality and/or timing mechanisms. Also, each sub-system may utilize a different data endian, a different word length, and/or a different instruction set.

Thus, the SoC having a safety channel is improved upon and provided a greater level of fault tolerance through the additional redundant safety channels. Moreover, the use of different processing environments (e.g., different processing cores, power supplies, etc.) for implementing each of the different sub-systems further mitigates the potential systematic failures that may occur in a homogenous system thereby greatly reducing any latent failures caused by common errors in design flow and tools.

Although particular examples have been shown and described, it will be understood that they are not intended to limit the claimed invention, and it will be made obvious to those skilled in the art that various changes and modifications may be made without departing from the spirit and scope of the claimed invention. The specification and drawings are, accordingly, to be regarded in an illustrative rather than restrictive sense. The claimed invention is intended to cover alternatives, modifications, and equivalents.

What is claimed is:

1. A system on a chip (SoC) for providing safety hardware fault tolerance and/or safety software fault tolerance, comprising:
    a first safety sub-system having a first safety channel;
    a second safety sub-system having a second safety channel; and
    a third sub-system;
    wherein the first safety sub-system is independent of the second safety sub-system to allow the second safety sub-system to communicate through the second safety channel when the first safety sub-system or the third sub-system fails, and further to allow the first safety sub-system to communicate through the first safety channel when the second safety sub-system or the third sub-system fails.

2. The SoC of claim 1, wherein the first safety sub-system comprises a programmable logic sub-system.

3. The SoC of claim 1, wherein the second safety sub-system comprises an application processor sub-system or a real-time processor sub-system.

4. The SoC of claim 1, wherein the third sub-system comprises a safety sub-system having a third safety channel.

5. The SoC of claim 4, wherein the third safety sub-system is independent of the first safety sub-system and the second safety sub-system to allow the third safety sub-system to communicate through the third safety channel when the first safety sub-system or the second safety sub-system fails.

6. The SoC of claim 1, wherein the first safety sub-system, the second safety sub-system and the third sub-system have respective voltage and temperature monitoring capabilities.

7. The SoC of claim 1, wherein the first safety sub-system has a safety integrity level that is higher than a safety integrity level of the second safety sub-system.

8. The SoC of claim 1, wherein the first safety sub-system has a safety integrity level that is lower than a safety integrity level of the second safety sub-system.

9. The SoC of claim 1, wherein the first safety sub-system has a safety integrity level that equal to a safety integrity level of the second safety sub-system.

10. The SoC of claim 1, wherein the third sub-system comprises a non-safety sub-system.

11. The SoC of claim 1, wherein the first safety sub-system, the second safety sub-system, and the third sub-system are implemented using different respective processor types.

12. The SoC of claim 1, wherein the first safety sub-system is implemented using state machine(s) in programmable logic, and wherein the second safety sub-system and the third sub-system are implemented using different respective processor types.

13. The SoC of claim 1, wherein the first safety sub-system is relocatable statically or dynamically.

14. The SoC of claim 1, wherein the first safety sub-system, the second safety sub-system, and the third sub-system each use a different data endian, a different word length, and/or a different instruction set.

15. A method for providing for safety hardware fault tolerance and/or safety software fault tolerance to a system-on-a-chip (SoC), the method comprising:
    providing a first safety channel for a first safety sub-system of the SoC; and
    providing a second safety channel for a second safety sub-system of the SoC;
    wherein the first safety sub-system is independent of the second safety sub-system to allow the second safety sub-system to communicate through the second safety channel when the first safety sub-system fails, and further to allow the first safety sub-system to communicate through the first safety channel when the second safety sub-system fails.

16. The method of claim 15, wherein the first safety sub-system comprises a programmable logic sub-system.

17. The method of claim 15, wherein the second safety sub-system comprises an application processor sub-system or a real-time processor sub-system.

18. The method of claim 15, further comprising providing a third safety channel for a third safety sub-system of the SoC.

19. The method of claim 15, further comprising providing the first safety sub-system and the second safety sub-system with independent processing environments.

20. The method of claim 19, wherein the independent processing environments comprise independent power sources, reset abilities, temperature controls, bus structures, or a combination of the foregoing.

\* \* \* \* \*